(12) United States Patent
Zhai et al.

(10) Patent No.: US 10,833,515 B2
(45) Date of Patent: Nov. 10, 2020

(54) AUTOMATIC CHARGING DEVICE FOR AN AGV ON AN AUTOMATED CONTAINER TERMINAL AND CHARGING METHOD THEREFOR

(71) Applicant: Shanghai Maritime University, Shanghai (CN)

(72) Inventors: Lin Zhai, Shanghai (CN); Jianxin Chu, Shanghai (CN); Fan Wang, Shanghai (CN)

(*) Notice: Subject to any disclaimer, the term of this patent is extended or adjusted under 35 U.S.C. 154(b) by 564 days.

(21) Appl. No.: 15/325,644

(22) PCT Filed: Oct. 28, 2015

(86) PCT No.: PCT/CN2015/093032
§ 371 (c)(1),
(2) Date: Oct. 18, 2017

(87) PCT Pub. No.: WO2017/024677
PCT Pub. Date: Feb. 16, 2017

(65) Prior Publication Data
US 2018/0152031 A1 May 31, 2018

(30) Foreign Application Priority Data

Aug. 12, 2015 (CN) .......................... 2015 1 0491835

(51) Int. Cl.
*H02J 7/00* (2006.01)
*G01C 21/26* (2006.01)
(Continued)

(52) U.S. Cl.
CPC ............ *H02J 7/0027* (2013.01); *B60L 53/14* (2019.02); *B60L 53/35* (2019.02); *B60L 53/65* (2019.02);
(Continued)

(58) Field of Classification Search
CPC ..... H02J 7/0027; H02J 7/0042; H02J 2310/48
(Continued)

(56) References Cited

U.S. PATENT DOCUMENTS 5,023,790 A * 6/1991 Luke, Jr. .......... G05B 19/41865
180/168
2002/0145402 A1 10/2002 Ueda et al.
(Continued)

FOREIGN PATENT DOCUMENTS

CN 202827179 U 8/2012
CN 103022586 A 12/2012
CN 103022586 * 4/2013

*Primary Examiner* — Richard Isla
*Assistant Examiner* — Tessema Kebede
(74) *Attorney, Agent, or Firm* — Lei Jiang, Esq.

(57) ABSTRACT

An automatic charging device for an AGV on an automated container terminal and a charging method using the same are disclosed. The automatic charging device comprises a vehicle-mounted device and a ground device. The vehicle-mounted device comprises RFID read-write coils, a charging connector buffer device, a charging connector, a power measuring module, a vehicle charging controller and a vehicle-mounted wireless module. The ground device comprises an RFID label array, a power panel, a conductive groove, a pressure sensor, an electromagnet, a ground charging controller and a ground wireless module. The hook shaped charging plug, the charging connector buffer device and the power panel with the electromagnet improve success rate of connection between the power supply and the plug, and improve AGV working efficiency. RFID technology is used for positioning the charging region with high reliability. The pressure sensor and the safety cover ensure safety of the charging process and prevent electric leakage.

7 Claims, 12 Drawing Sheets

(51) Int. Cl.
*G01R 31/382* (2019.01)
*H02J 7/02* (2016.01)
*B60L 53/65* (2019.01)
*B60L 53/35* (2019.01)
*B60L 53/14* (2019.01)
*G08G 1/0968* (2006.01)
*H01R 11/12* (2006.01)
*H01R 13/62* (2006.01)

(52) U.S. Cl.
CPC ........... *G01C 21/26* (2013.01); *G01R 31/382* (2019.01); *G08G 1/096827* (2013.01); *H01R 11/12* (2013.01); *H01R 13/6205* (2013.01); *H02J 7/022* (2013.01); *Y02T 10/70* (2013.01)

(58) Field of Classification Search
USPC ......................... 320/104, 107, 109, 128, 137
See application file for complete search history.

(56) References Cited

U.S. PATENT DOCUMENTS

| | | | |
|---|---|---|---|
| 2011/0077809 A1* | 3/2011 | Leary | B60L 53/65 701/22 |
| 2011/0144828 A1* | 6/2011 | Chengalva | F41H 7/005 701/2 |
| 2013/0193918 A1* | 8/2013 | Sarkar | B60L 15/10 320/109 |
| 2014/0139181 A1* | 5/2014 | Elias | B60L 53/20 320/108 |
| 2014/0354229 A1* | 12/2014 | Zhao | B60L 11/1846 320/109 |
| 2016/0336772 A1* | 11/2016 | Dallachiesa | B60L 53/14 |
| 2017/0106763 A1* | 4/2017 | Dow | B60L 53/65 |
| 2018/0001777 A1* | 1/2018 | Kilic | B60L 53/30 |

* cited by examiner

AUTOMATIC CHARGING DEVICE FOR AN AGV ON AN AUTOMATED CONTAINER TERMINAL AND CHARGING METHOD THEREFOR

FIELD OF INVENTION

The present invention relates to a charging device for a carrier on a container terminal, and relates in particular to an automatic charging device for an automatic guided vehicle on an automated container terminal and a charging method therefor.

BACKGROUND ART

New generation automated container terminals realize automatic loading, unloading, and transporting of containers with a substantial raise in loading and unloading efficiency. For the intelligent horizontal transportation system, which being one of the six sub-systems in the new generation automated container terminal, the containers in-between a QC (quay crane) and an ARMG (automated rail mounted gantry) are engaged by automatic guided vehicles (AGVs). An AGV needs to be charged automatically after a specific period of operation.

A typical charging process is as follows: when the voltage of the battery of the AGV is below a specific threshold, the automatic charging process is initiated and the current task node is saved in storage, the AGV heads for the charging region (the place where AGVs are automatically charged) to be charged under control of its onboard control module, the AGV tries to connect with a power supply with the help of positioning by a navigation module, charging starts when the connection is successful, and when the power of the battery reaches a specific threshold, the charging process is completed and returns to the task node.

Of the feasible charging devices there feature mainly three types: a rigid insertion type, a sliding contact type, and a non-contact type. The rigid insertion type inserts a plug precisely into a socket for charging; the gliding contact type drives an electric brush of a collector to come to close contact with a carbon brush on the vehicle via a telescoping mechanism to realize harvesting of power in a sliding manner; the non-contact type transfers electric energy by means of energy coupling via a coil, based on electromagnetic induction principle.

In an actual scenario of prior art, the AGV might run out of electricity at any time. Not having sufficient residual power to reach the charging region, the AGV might simply stall, and the normal operation of the other AGVs might be obstructed. Further, if several AGVs run out of electricity at the same time, congestion will result at the charging region and negatively impact operation efficiency in the container terminal. In addition, the above mentioned three types of charging device, in particular the rigid insertion type and the sliding contact type, require the AGV to be precisely positioned after entering the charging region in order for the plug to be in contact with the power supply or for the electric brush of the collector to be in contact with the carbon brush on the vehicle, and the charging process starts when power is applied. In case the AGV fails to park in the charging region precisely, it needs to start over the parking process anew. Further, the sliding contact type requires supports, which would be a negative factor for site safety. As for the non-contact charging type, besides its requirement for precise positioning, its insufficient transmission power and incapability of providing quick charging for the lithium battery are all detrimental to the AGV operation efficiency. Finally, the power supply is exposed outdoors and thus its life time would be shortened due to the adverse outdoor conditions in a container terminal.

SUMMARY OF THE INVENTION

The first object of the present invention is to guarantee the lithium battery be fully charged within a short time by employing a fast charging lithium iron phosphate battery as a driving power supply. The second object of the present invention is to guarantee a continuous operation of the AGV by arranging an automatic charging device for an AGV in an AGV buffer region of the container yard and by charging the AGV with an online charging process.

The third object of the present invention is to provide a hook shaped automatic charging device, so as to enable the AGV to establish connection with the charging device even in a failure to reach the AGV charging buffer region precisely, to guarantee successful connection of the AGV with the automatic charging device and to elevate operation efficiency of AGV. Further, an inspection device is arranged to ensure safety for the plug and the power supply.

As a driving power supply, the fast charging lithium iron phosphate battery has the advantage of high energy density, high voltage plateau, good thermal stability, and a long cycle life, which guarantee the battery to be fully charged within a short time. In consideration of AGV operation continuity, the AGV automatic charging device is arranged in the AGV charging buffer region of the container yard and charges in an online manner.

To sum up, each time the AGV enters the AGV charging buffer region of the container yard to be charged by the automatic charging device, it is charged for 90 s with a charged power of 2.5 kWh, approximately coinciding with energy consumption of the AGV in a mission cycle. Thus the problem of the AGV's failure to reach the charging region because of its insufficient residual energy is avoided and the problem of too many AGVs in the charging region is resolved as well.

Another issue is that the afore-mentioned three types of charging device are dependent on a high precision of parking position of the AGV, have insufficient site safety and low transmission power, and have an exposed power supply. The present invention provides a hook shaped automatic charging device to ensure that the AGV is smoothly connected even in its failure to reach the charging buffer region, thus guaranteeing connection success rate of the AGV with the charging device and increasing the operation efficiency of the AGV. Further, an inspection device is arranged to guarantee safety between the plug and the power supply, and to convert the power supply to a dc power source, so that the AGV can be charged more quickly. Finally, a protection device is arranged to protect the ground power supply.

The technical solution of the present invention is as follows:

An automatic charging device for an AGV on an automated container terminal comprises a vehicle-mounted device and a ground device. The vehicle-mounted device comprises RFID read-write coils, each arranged on an underframe at front and rear ends of the AGV respectively; a charging connector buffer device, arranged on the underframe at a middle portion of the AGV; a hook shaped charging connector, connected with the charging connector buffer device; a power measuring module, arranged inside the AGV; and a vehicle charging controller, connected with the RFID read-write coils, the charging connector buffer device, the hook shaped charging connector and the power measuring module, and a vehicle-mounted wireless module therein, capable of receiving/sending wireless signal.

The charging connector buffer device consists of a movable module and two springs fixed on the underframe at the middle portion of the vehicle by fasteners, and a motor is mounted on the movable module being connected with the hook shaped charging connector. In case of a deviation in parking the AGV, the hook shaped charging connector is moved forward or backward by the movable module under stretching or contracting of the springs to connect with a ground power source.

One end of a first rectangular module of the hook shaped charging connector is connected with the movable module via the motor, the other end thereof is connected with one end of a second rectangular module via another motor, the other end of the second rectangular module is arranged with a charging plug, and the charging plug connects with a battery pack via wires embedded in the hook shaped charging connector and the charging connector buffer device. The vehicle charging controller is connected with all the other components of the vehicle-mounted device to control them to execute correspondingly, and the vehicle-mounted wireless module is employed for communication with the ground device.

The ground device comprises an RFID label array on the ground, dividing an entire charging buffer region into a charging waiting region and a charging region; a power panel arranged on the ground, which is collapsible and erectable; a conductive groove arranged above the power panel; a pressure sensor arranged on the conductive groove; an electromagnet arranged directly behind the conductive groove; a three-phase voltage source, a rectifier, a DC/DC device; a ground charging controller, connected with and controlling the RFID label array, the power panel, the conductive groove, the pressure sensor, the electromagnet, the three-phase voltage source, the rectifier and the DC/DC device, and a ground wireless module arranged inside the ground charging controller (304) for receiving/sending wireless signals.

The pressure sensor is attached to the conductive groove and the electromagnet is arranged directly behind the conductive groove. The power panel rests in the ground and is covered by a safety cover. The right end of the safety cover is connected with the ground via an axle and the other end can move freely. The spring connects the safety cover with the ground. When the power panel lies flat, its upper left corner is connected with the ground via the motor. The three-phase voltage source, the rectifier, and the DC/DC device are connected in series to provide DC power for the charging device. The ground charging controller is connected with each device to control them to execute correspondingly. Meanwhile the ground wireless module is employed for communication with the ground device.

When the charging plug is successfully inserted into the conductive groove, pressure is exerted on the conductive groove, and correspondingly the pressure sensor on the conductive groove outputs a signal to the charging controller to enable powering the conductive groove, such that electrical safety is ensured. In case of a distance existing between the hook shaped charging connector and the power panel, the electromagnet will attract the charging plug to enable the charging connector buffer device to move forward the charging plug, so that the charging plug can be successfully inserted into the conductive groove. Thereby, connection success rate is improved.

Meanwhile, with regards to the ground device, the pressure sensor is attached to the conductive groove and the electromagnet is arranged directly behind the conductive groove; the power panel rests in the ground and is covered by a safety cover. The right end of the safety cover is connected with the ground via an axle and the other end can move freely; the spring connects the safety cover with the ground. When the power panel lies flat, its upper left corner is connected with the ground via the motor. Wherein, the three-phase voltage source, the rectifier, and the DC/DC device are connected in series to provide DC power for the charging device. The ground charging controller is connected with each device to control them to execute correspondingly. Meanwhile the ground wireless module is employed for communication with the ground device.

The hook shaped charging connector is in folded state when not operating, and the motor on the movable module drives the first rectangular module to a position at which the first rectangular module is parallel with the movable module, and meanwhile the motor at the other end of the second rectangular module drives the second rectangular module to a position at which the second rectangular module is parallel with the first rectangular module; when the hook shaped charging connector is operating, the motor on the movable module drives the first rectangular module to a position at which the first rectangular module is at an angle of 30 degree to the movable module, and meanwhile the motor at the other end of the second rectangular module drives the second rectangular module to a position at which the second rectangular module is at an angle of 30 degree to the first rectangular module, and the hook shaped charging connector stretches out to become hook-shaped for connection with the ground power source.

The present invention also provides a charging method for the automatic charging device for the AGV on the automated container terminal, which comprises the following steps:

Step 1, in which step after a mission cycle from a quay crane to a container yard of the container terminal, guided by a positional information read from the RFID label array embedded in the container yard, the AGV enters the charging buffer region as set in a path for charging, or lines up in the charging waiting region in case of another AGV being under a charging process in the charging region;

Step 2, in which step the RFID read-write coil at the front end of the AGV, at entering of the AGV into the charging region, reads a positional information of a first RFID label at a left side of the charging region and transmits the information to the vehicle charging controller via a wireless signal; the vehicle charging controller transmits the wireless signal to the ground wireless module of the ground device via the wireless module, and the ground charging controller enables the motor arranged in the power panel in the ground to be operated to erect the power panel, which pushes up the safety cover; the vehicle charging controller enables the motor on the movable module to drive the first rectangular module to a position at which the first rectangular module is at an angle of 30 degree to the movable module, and meanwhile enables the motor at the other end of the second rectangular module to drive the second rectangular module to a position at which the second rectangular module is at an angle of 30 degree to the first rectangular module, the hook shaped charging connector then stretches out to become hook-shaped and ready for connection with the ground power source; and meanwhile the electromagnet above the power panel is powered on;

Step 3, in which step the AGV arrives and stops at the charging region, the RFID read-write coils on the front and rear of the AGV read information of RFID label on the ground to determine a parking position for the AGV, with a position of the power panel in the charging region corresponding to a position of the hook shaped charging connector at the parking position of the AGV; the hook shaped charging connector is attracted by the electromagnet, the charging plug is inserted stably into the power panel and connected with the conductive groove;

Step 4, in which step the pressure sensor on the power panel sends out a signal to the ground charging controller, the ground charging controller processes the signal and enables the conductive groove to connect to an external power source, and the AGV starts charging operation;

Step 5, in which step the power measuring module detects that the AGV is fully charged when its detected power reaches a specific threshold indicating end of charging, signal is transmitted to the ground wireless module of the ground device by the vehicle-mounted wireless module, the ground wireless module transmits the signal to the ground charging controller to process, and instructing the ground device to stop powering the electromagnet, the conductive groove is powered off, the power panel is folded down and the safety cover covers up under stress of the spring; meanwhile, the power measuring module, via the vehicle charging controller, controls the motor on the movable module to drive the first rectangular module to a position at which the first rectangular module is parallel with the movable module and the motor at the other end of the second rectangular module to drive the second rectangular module to a position at which the second rectangular module is parallel with the first rectangular module; the hook shaped charging connector contracts and detaches from the ground power source; and the AGV leaves the charging region.

The present invention is characteristic and advantageous in the following manner:

(1) the charging plug is hook shaped;
(2) the power panel is capable of being folded down; (3) the electromagnet provided facilitates precise connection of the charging plug with the power panel; (4) with the help of the buffer device, the charging plug can connect with power source under attraction by the electromagnet, when there is a deviation in parking the AGV; (5) the pressure sensor detects to determine if the charging plug is properly connected and thus ensures safety in the charging process and prevents leakage; (6) the safety cover designed is flush with the ground, guaranteeing electric safety of the power panel and preventing blockage; (7) the RFID label is employed for positioning the AGV in the charging buffer region; (8) the hook shaped charging plug and the power panel having an electromagnet furnished can improve success rate of connection of the plug with the power source, and improve AGV operation efficiency; (9) the reliability of locating the charging region is enhanced by using RFID technology; (10) the pressure sensor and the safety cover ensure safety of charging process and prevent current leakage.

In combination with the figures and embodiments hereunder provided, the present invention will be enunciated in details.

Wherein, reference signs are as follows:
101: RFID label, 102: motor, 103: electromagnet, 104: hook shaped charging connector, 105: pressure sensor, 106: charging connector buffer device, 107: power measuring module, 108: power panel, 109: RFID read-write coil, 110: conductive groove, 111: charging plug, 112: battery pack, 201: safety cover, 202: spring, 203: movable module, 204: axle, 301: three-phase voltage source, 302: rectifier, 303: DC/DC device, 304: ground charging controller, 305: bus, 306: vehicle charging controller, 401: second rectangular module, 402: first rectangular module, 403: fastener, 501: vehicle-mounted wireless module, 502: ground wireless module.

DETAILED DESCRIPTION OF THE PREFERRED EMBODIMENTS

Figure 1:
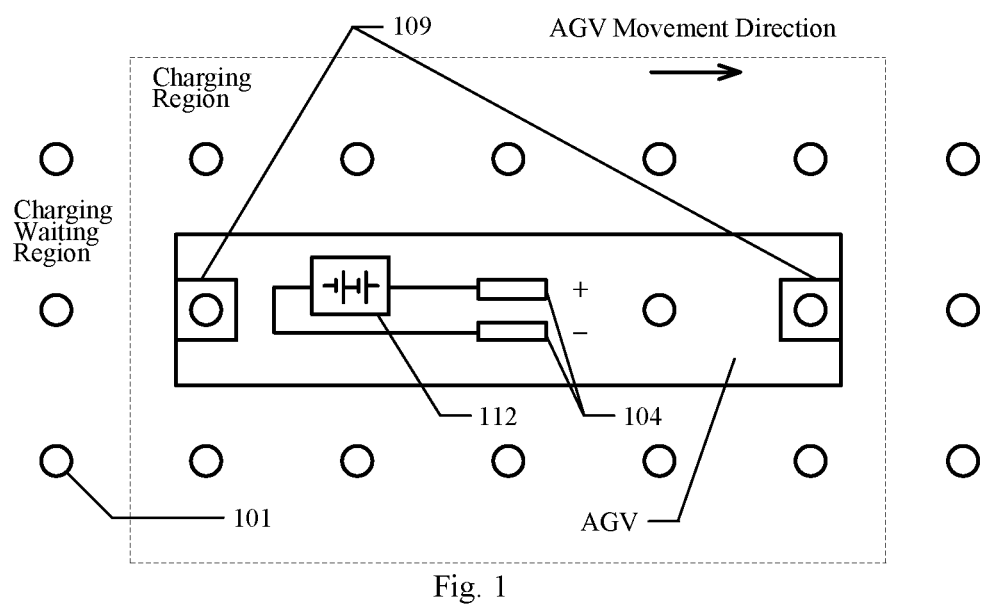
FIG. 1 is a plan view of the charging buffer region.

The entire AGV charging buffer region (place where AGV is charged or to be charged) is divided into a charging waiting region (place where AGV is waiting to be charged) and a charging region (place where AGV is charged). The division of the regions is mainly based on the RFID label array information. The RFID label array consists of several RFID labels with equal distances therebetween, as shown in FIG. 1. The array of circles inside the whole charging buffer region is referred to as RFID label 101 array. The region inside the dashed box is the AGV charging region, and the rectangle represents the AGV. The end of the vehicle which faces the direction of AGV' movement is the front end of the vehicle, and the other end the rear end of the vehicle. The rectangles at the front and rear ends of the vehicle are two RFID read-write coils 109 arranged at front and rear ends of the AGV. The AGV mainly reads the information of RFID label in the charging region via the RFID read-write coils arranged at the front and rear ends of the AGV, to determine the positional status of the AGV in the charging region.

Meanwhile, as shown in FIG. 1, two hook shaped charging connectors 104 are arranged at the middle portion of the AGV, and connect respectively with the positive and negative poles of the battery pack 112 of AGV. The battery pack will be charged when the two hook shaped charging connectors 104 are connected respectively with the positive and negative poles of the ground power source.

The automatic charging device for the AGV mainly consists of a vehicle-mounted device and a ground device.

The vehicle-mounted device mainly comprises RFID read-write coils 109 each arranged on the underframe at the front and rear ends of the AGV respectively, a charging connector buffer device 106 arranged on the underframe at the middle portion of the vehicle, a hook shaped charging connector 104 connected with the charging connector buffer device 106, a power measuring module 107 arranged inside the vehicle, and a vehicle charging controller 306 connected with each of the above components and a vehicle-mounted wireless module 501 therein capable of receiving and sending wireless signal.

Figure 2:
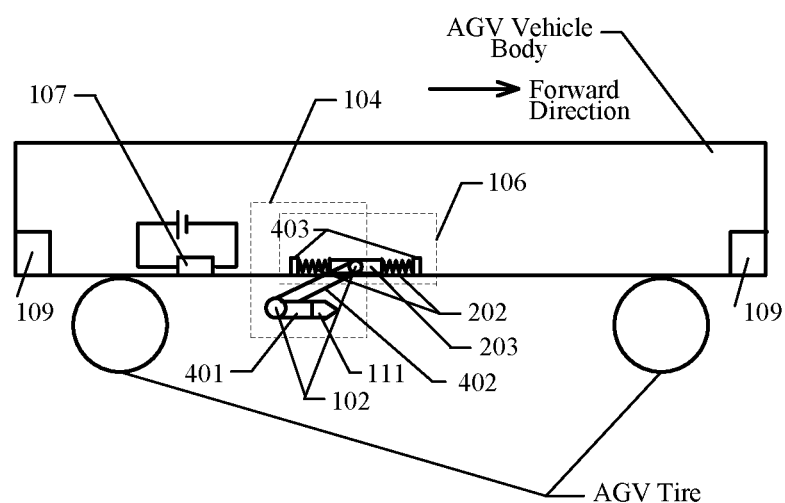
FIG. 2 is a side view of the vehicle-mounted device of the automatic charging device for the AGV on the automated container terminal according to the invention.

In the vehicle-mounted device of the AGV, the charging connector buffer device 106 on the underframe at the middle portion of the vehicle is connected to the hook shaped charging connector 104 at the middle portion of the AGV, for correcting a position deviation of the AGV in respect of the charging region due to the positioning error of the RFID technology. As shown in FIG. 2, the RFID read-write coils are arranged on the underframe at the middle portion of the AGV, facilitating reading the ground RFID label. The charging connector buffer device 106 consists of a movable module 203 and two springs 202 fixed on the underframe at the middle portion of the vehicle via fasteners 403, the motor 102 is mounted on the movable module 203 being connected with the hook shaped charging connector 104. The hook shaped charging connector 104 will be moved forward or backward by the movable module 203 under the stretching or contracting of the two springs to connect with a ground power supply in case of a deviation in parking the AGV.

Figure 3:
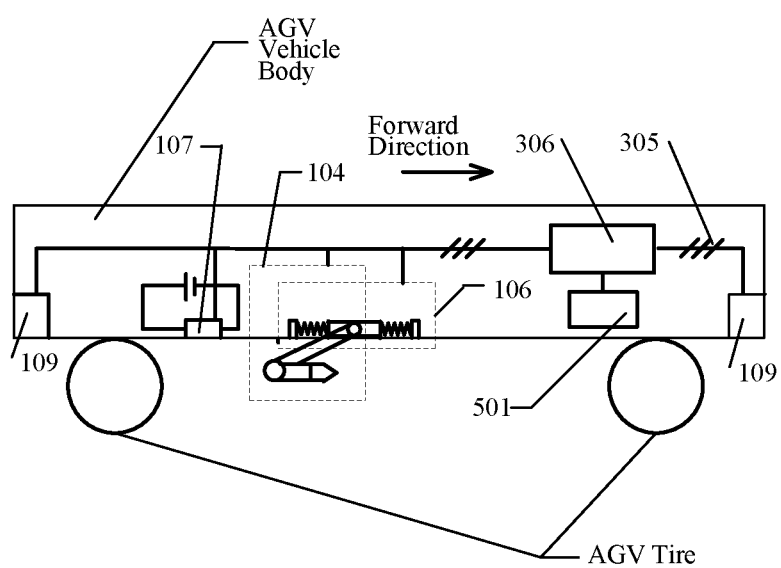
FIG. 3 is a schematic diagram of connection of the vehicle charging controller of the automatic charging device for the AGV according to the invention, with its controlled objects thereof via a bus.

Meanwhile, as shown in FIG. 2, one end of the first rectangular module 402 of the hook shaped charging connector 104 is connected with the movable module 203 via a motor 102, while the other end thereof is connected with one end of the second rectangular module 401 via another motor. Another end of the second rectangular module 401 is arranged with a charging plug 111. The charging plug 111 is connected with a battery pack 112 via wires embedded in the hook shaped charging connector 104 and the charging connector buffer device 106. The vehicle charging controller 306 is connected with all the other components of the vehicle-mounted device to control them to execute correspondingly, and meanwhile the vehicle-mounted wireless module 501 is employed for communication with the ground device. As shown in FIG. 3, each component of the vehicle-mounted device is connected with the vehicle charging controller 306 via the bus 305.

Figure 4:
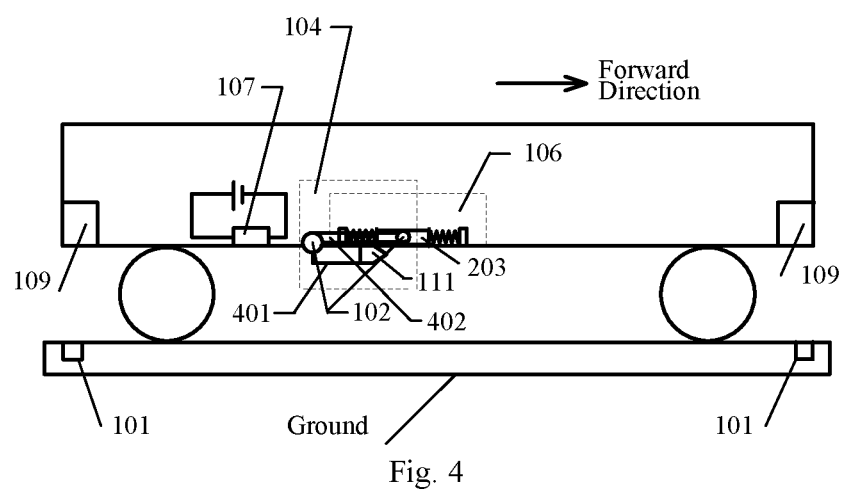
FIG. 4 is a side view of the AGV according to the invention in the waiting region.

The hook shaped charging connector 104 is in folded state when not operating, so as to protect the charging device and save space. As shown in FIG. 4, the motor on the movable module 203 drives the first rectangular module 402 to a position at which the first rectangular module 402 is parallel with the movable module 203, and meanwhile the motor at the other end of the second rectangular module 401 drives the second rectangular module 401 to a position at which the second rectangular module 401 is parallel with the first rectangular module 402.

Figure 5:
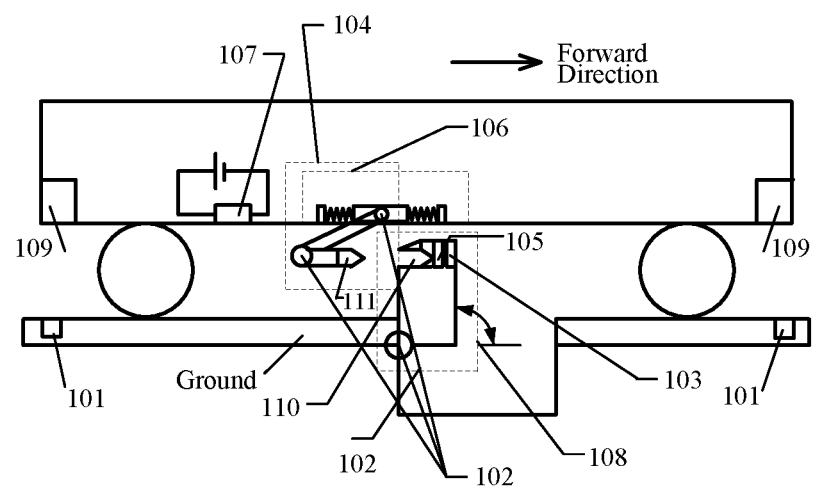
FIG. 5 is a structural perspective view of the vehicle-mounted portion of the automatic charging device for the AGV in the automatic charging region according to the invention.

When the hook shaped charging connector 104 is to operate, the motor on the movable module 203 drives the first rectangular module 402 to a position at which the first rectangular module 402 is at an angle of 30 degree to the movable module 203, and meanwhile the motor at the other end of the second rectangular module 401 drives the second rectangular module 401 to a position at which the second rectangular module 401 is at an angle of 30 degree to the first rectangular module 402. So the hook shaped charging connector 104 stretches out to become hook-shaped for connection with the ground power source. As shown in FIG. 5, the stretched hook shaped charging connector 104 causes the charging plug 111 to be away from the ground by a distance equal to the distance of the conductive groove 110 above the power panel 108 from the ground after the power panel is erected. The conductive groove 110 acts as "female", and the width of opening thereof is a little larger than the width of the charging plug 111 which acts as "male".

The ground device mainly comprises an array of RFID labels 101 arranged on the ground, an erectable and collapsible power panel 108 arranged in the ground, a conductive groove 110 above the power panel 108, a pressure sensor 105 arranged on the conductive groove 110, an electromagnet 103 arranged directly behind the conductive groove, a three-phase voltage source 301, a rectifier 302, a DC/DC device 303, and a ground charging controller 304 and a ground wireless module 502 therein for sending and receiving a wireless signal, and a safety cover 201 also belongs to the ground device.

Figure 6:
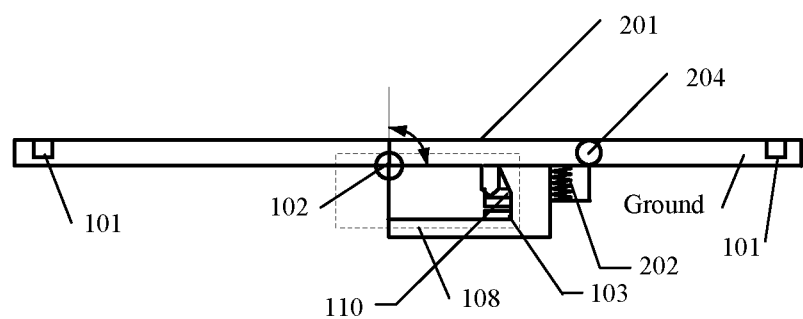
FIG. 6 is a structural perspective view of the ground portion of the automatic charging device for the AGV according to the invention when the power panel is withdrawn.
Figure 8:
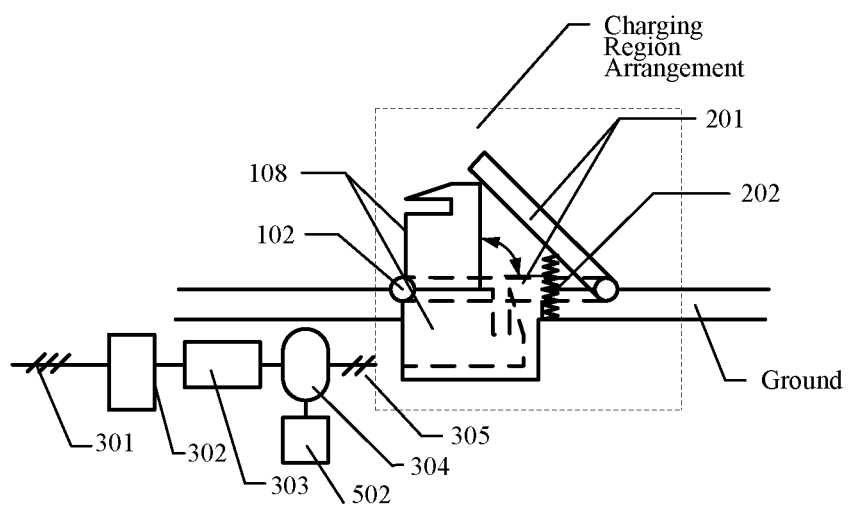
FIG. 8 is a schematic diagram of connection of the ground charging controller of the automatic charging device for the AGV according to the invention, with its controlled objects thereof.

Meanwhile, in the ground device, as shown in FIG. 5, the pressure sensor 105 is attached to the conductive groove 110 and the electromagnet 103 is arranged directly behind the conductive groove 110. As shown in FIG. 6, the power panel 108 lies flat in the ground with a safety cover 201 covering it, the right end of the safety cover 201 is connected with the ground via an axle 204 and the other end can move freely. The spring 202 connects the safety cover 201 with the ground. When the power panel 108 lies flat, the upper left corner of it is connected with the ground via the motor 102. As shown in FIG. 8, the three-phase voltage source 301, rectifier 302, DC/DC device 303 are connected in series to provide DC power. The ground charging controller 304 is connected with all the other components of the ground device to control them to execute correspondingly, and meanwhile the ground wireless module 502 is employed for communication with the ground device.

When the charging plug 111 is successfully inserted into the conductive groove 110, pressure is exerted on the conductive groove 110, and correspondingly the pressure sensor 105 on the conductive groove 110 outputs a signal to the charging controller 304 to enable powering the conductive groove 110, such that electrical safety is ensured. In case of a distance existing between the hook shaped charging connector 104 and the power panel 108, the electromagnet will attract the charging plug to enable the charging connector buffer device 106 to move forward the charging plug 111, so that the charging plug 111 can be successfully inserted into the conductive groove 110. Thereby, connection success rate is improved.

In order to ensure that the movement of the AGV is not affected by the power panel 108 when the latter is not operating, and also to ensure electrical safety of the power panel 108 and to avoid blockage, the power panel 108 will lie flat in the ground. As shown in FIG. 6, the power panel 108 lies flat in the ground with a safety cover 201 covering it. The right end of the safety cover 201 is connected with the ground via an axle 204 and the other end can move freely.

Figure 7:
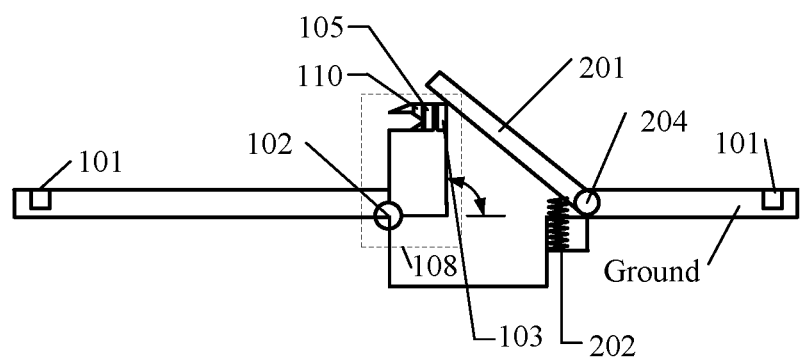
FIG. 7 is a structural perspective view of the ground portion of the automatic charging device for the AGV according to the invention when the power panel is stretched out.

The spring 202 connects the safety cover 201 with the ground. When the power panel 108 lies flat, the upper left corner of it is connected with the ground via the motor 102. When the power panel 108 is to be erected to operate, the motor 102 drives the power panel 108 to erect, and the erected power panel will push up the safety cover 201. As shown in FIG. 7, the safety cover 201 is pushed up, and the springs 202 are stretched, the power panel 108 erects. After completion of charging, the power panel is fold down by the motor 102 and the safety cover 201 is pulled back by the springs 202.

Meanwhile, in order to save space and ensure electrical safety, the three-phase voltage source 301, the rectifier 302, the DC/DC device 303 and the ground charging controller 304 are arranged in the ground, as shown in FIG. 8. The three-phase voltage source 301, the rectifier 302 and the DC/DC device 303 are connected in series to provide DC power to the charging device. The ground charging controller 304 mainly receives signals from all the other components of the ground device, and controls them to operate correspondingly. The ground charging device 304 controls the other components of the ground device via the bus 305, and controls the vehicle-mounted device by using wireless signals.

Figure 9:
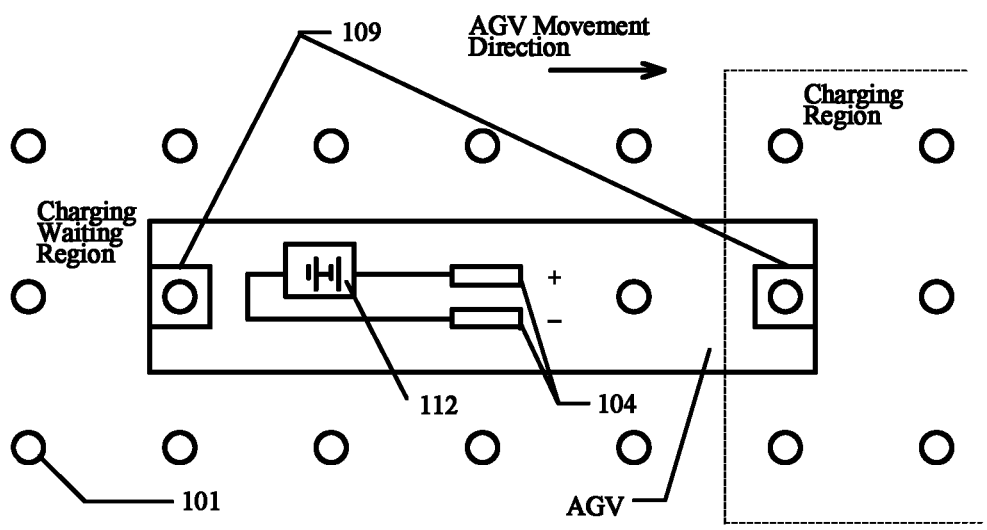
FIG. 9 is a perspective view of the AGV according to the invention, being charged in the charging region.
Figure 10:
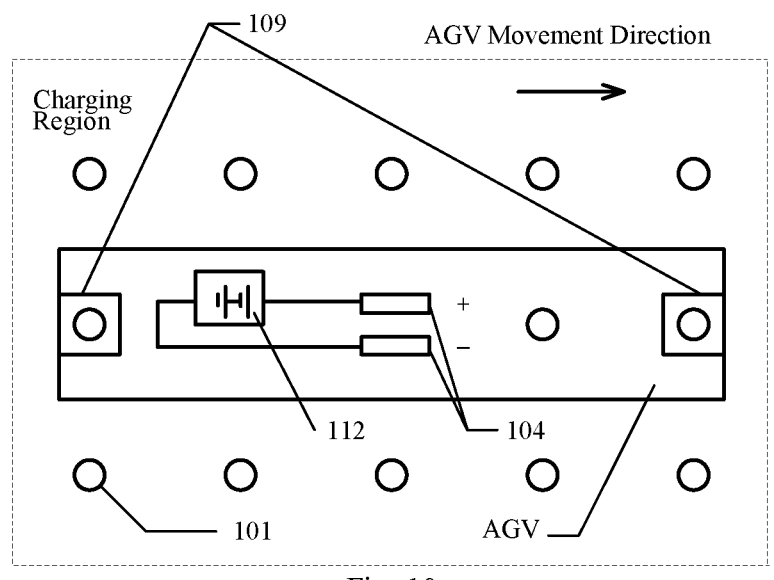
FIG. 10 is a perspective view of the AGV according to the invention, parking in the charging region,
FIG. 11 a perspective view of position of the power panel of the automatic charging device for the AGV according to the invention.
Figure 11:
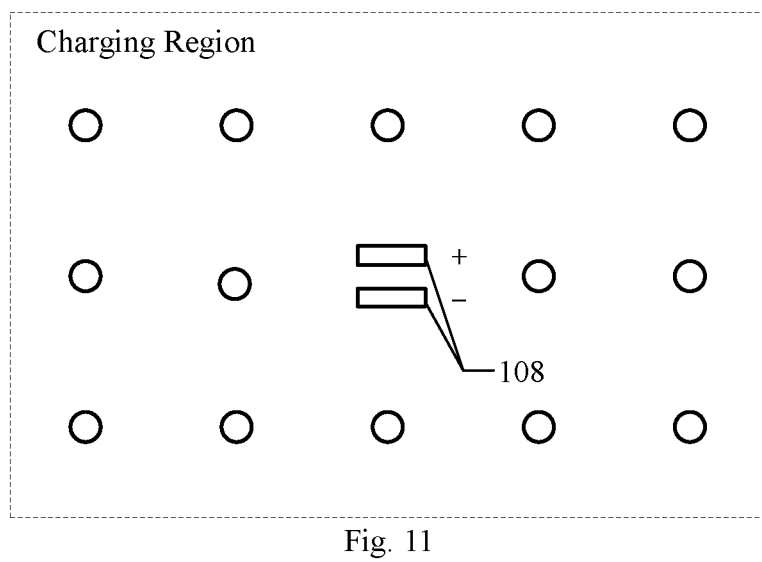

The RFID label array of the ground device reads the label information via the vehicle-mounted read-write coils to determine the AGV position. As shown in FIG. 9, once the RFID read-write coil 109 at the front end of the AGV reads positional information of the first RFID label 101 at the left side of the charging region, it is determined that the AGV has entered the charging region. As shown in FIG. 10, with the RFID read-write coils at the front and rear ends of the vehicle reading the RFID label information, the parking position of the AGV can be determined. And as shown in FIG. 11, the position of the power panel 108 in the charging region corresponds to the position of the hook shaped charging connector 104 in the AGV when the AGV parks.

The above describes the components of the whole automatic charging device for the AGV, the connection pattern and the roles of each component in the whole charging device. When the AGV enters the charging region, the components operate in a manner as follows:

The label information of the first RFID label at the left side of the charging region read by the RFID read-write coil at the front end of the AGV is processed by the vehicle charging controller; the vehicle charging controller sends instructions to each of the other components of the vehicle-mounted device, to enable the hook shaped charging connector to stretch, and meanwhile transmits signals to the ground wireless module via the vehicle-mounted wireless module; the signals are processed by the ground charging controller, the ground charging controller sends instructions to each of the other components of the ground device to erect the power panel, the safety cover is pushed up, and meanwhile the electromagnet above the power panel is powered on. The RFID read-write coils at the front and rear ends of the AGV read the information of the RFID labels to determine the parking position of the AGV. When the hook shaped charging connector is attracted to the electromagnet, the charging plug is inserted stably into the power panel, and the charging plug connects with the conductive groove. The pressure sensor outputs signals to the ground charging controller. The ground charging controller enables the conductive groove to connect with an external power source and the AGV starts the charging process. When the power measuring module detects that the charging process is fully completed, the vehicle-mounted wireless module transmits a signal to the ground wireless module of the ground device and the signal is processed by the ground charging controller; the ground charging controller sends instructions to the other components of the ground device to stop powering the electromagnet and the conductive groove, then the power panel is folded down, and the safety cover is pulled back by the springs; meanwhile, the vehicle charging controller instructs the hook shaped charging connector to contract and detaches from the ground power source. The AGV leaves the charging region.

Detailed steps of operation of the AGV automatic charging device:

(1) After a mission cycle from a quay crane to a container yard of the container terminal, the AGV, whose vehicle charging controller processes the positional information read by the RFID label array embedded in the container yard, enters the charging buffer region for charging, or lines up in the charging waiting region in case of another AGV being under a charging process in the charging region. (The top view of the AGV automatic charging buffer region is shown as in FIG. 1; the side view of the AGV in the waiting region is shown as in FIG. 2). Wherein, the path for the AGV can be set by any prior art path planning algorithm. (2) When the AGV enters the charging region, as shown in FIG. 9, the RFID read-write coil 109 at the front end of the AGV reads the positional information of the first RFID label 101 at the left side of the charging region and transmits the information to the vehicle charging controller 306 with wireless signals; the vehicle charging controller 306 transmits the wireless signals to the ground wireless module 502 of the ground device via the wireless module 501, and the ground charging controller 304 enables the motor 102 arranged in the power panel 108 in the ground operate to erect the power panel 108, which pushes up the safety cover 201; the vehicle charging controller 306 enables the motor 102 on the movable module 203 to drive the first rectangular module 402 to a position at which the first rectangular module 402 is at an angle of 30 degree to the movable module 203, and meanwhile enables the motor at the other end of the second rectangular module 401 to drive the second rectangular module 401 to a position at which the second rectangular module 401 is at an angle of 30 degree to the first rectangular module 402, the hook shaped charging connector 104 then stretches out to become hook-shaped and ready for connection with the ground power source; and meanwhile the electromagnet 103 above the power panel 108 is powered. (3) When the AGV arrives and stops at the charging region, as shown in FIG. 10, parking position is determined by the RFID read-write coils on the front and rear of the AGV reading information of RFID labels on the ground. As shown in FIG. 11, the hook shaped charging connector 104 faces the power panel 108 in the charging region when the AGV stops. The hook shaped charging connector 104 is attracted by the electromagnet; the charging plug being is inserted stably into the power panel 108 and connected with the conductive groove 110. (4) The pressure sensor 105 on the power panel sends out a signal, and the ground charging controller 304 enables the conductive groove 110 to connect with the external power source and the AGV starts charging process; (5) The power measuring module 107 detects that the AGV is fully charged when its detected power reaches a specific threshold which indicating the end of charging, signals are transmitted to the ground wireless module 502 of the ground device by the vehicle-mounted wireless module 501, the ground wireless module 502 transmits the signals to the ground charging controller 304 to process, and the ground charging controller 304 instructs the ground device to stop powering the electromagnet 103, the conductive groove 110 is power off, the power panel 108 is folded down and the safety cover 201 covers up under stress of the spring 202; meanwhile, the vehicle charging controller 306 controls the motor on the movable module 203 to drive the first rectangular module 402 to a position at which the first rectangular module 402 is parallel with the movable module 203 and the motor at the other end of the second rectangular module 401 to drive the second rectangular module 401 to a position at which the second rectangular module 401 is parallel with the first rectangular module 402, the hook shaped charging connector contracts and detaches from the ground power source; and the AGV leaves the charging region, as shown in FIG. 4.

Figure 12:
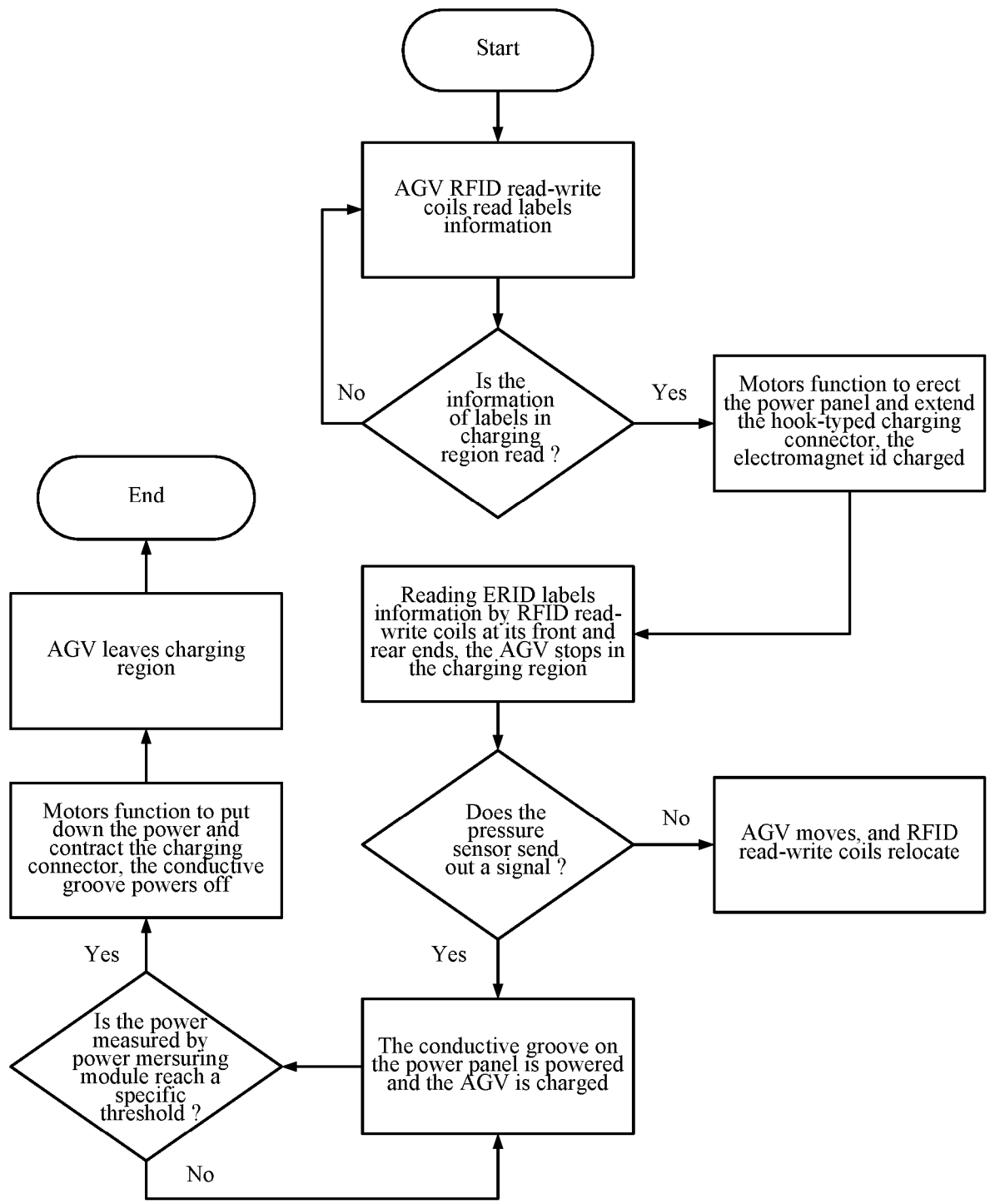
FIG. 12 is a flow chart of charging the automatic charging device for the AGV according to the invention.

A flow chart of the charging process of the automatic charging device for the AGV according to the invention is as shown in FIG. 12.

On an automated container terminal, the charging buffer region is arranged near the container yard. Each time after carrying containers from the quay crane to the yard, the AGV enters the AGV charging buffer region for charging. When a plurality of AGVs are to be charged in the AGV charging buffer region, the AGVs will be arranged by a Vehicle Management System (VMS) to enter the charging buffer region for charging in order, those that have not been arranged to enter yet will be waiting in the charging waiting region. When an AGV completes its charging process, a Vehicle Control System (VCS) will start the AGV and set a next mission path for it, and the AGV will operate its next mission cycle accordingly.

As above presents and describes the principles, characteristics and advantages of the invention. The protection scope of the present invention is defined as in the attached claims and equivalents thereof.

The invention claimed is:

1. An automatic charging device for an AGV on an automated container terminal, comprising a vehicle-mounted device and a ground device, wherein
the vehicle-mounted device comprises:
RFID read-write coils (109), each arranged on an underframe at front and rear ends of the automatic guided vehicle (AGV) respectively,
a charging connector buffer device (106), arranged on the underframe at a middle portion of the AGV,
a hook shaped charging connector (104), connected with the charging connector buffer device (106),
a power measuring module (107), arranged inside the AGV,
a vehicle charging controller (306), connected with the RFID read-write coils, the charging connector buffer device, the hook shaped charging connector and the power measuring module,
and a vehicle-mounted wireless module (501) in the vehicle charging controller, capable of receiving/sending a wireless signal;
the ground device comprises:
an RFID label array on the ground, dividing an entire charging buffer region into a charging waiting region and a charging region,
a power panel (108) arranged in the ground, which is collapsible and erectable,
a conductive groove (110) arranged on top of the power panel (108),
a pressure sensor (105) arranged on the conductive groove (110),
an electromagnet (103) arranged directly behind the conductive groove (110),
a three-phase voltage source (301), a rectifier (302), a DC/DC device (303),
a ground charging controller (304), connected with and controlling the RFID label array, the power panel (108), the conductive groove (110), the pressure sensor (105), the electromagnet (103), the three-phase voltage source (301), the rectifier (302) and the DC/DC device (303),
and a ground wireless module (502) arranged inside the ground charging controller (304) for receiving/sending the wireless signal;
the charging connector buffer device (106) consists of a movable module (203) and two springs (202) fixed on the underframe at the middle portion of the vehicle by fasteners (403), a motor (102) is mounted on the movable module (203) being connected with the hook shaped charging connector (104); in case of a deviation in parking the AGV, the hook shaped charging connector (104) is moved forward or backward by the movable module (203) under stretching or contracting of the springs to connect with a ground power source;
one end of a first rectangular module (402) of the hook shaped charging connector (104) is connected with the movable module (203) via the motor (102), the other end is connected with one end of a second rectangular module (401) via another motor, the other end of the second rectangular module (401) is arranged with a charging plug (111), the charging plug (111) connects with a battery pack (112) via wires embedded in the hook shaped charging connector (104) and the charging connector buffer device (106).

2. The automatic charging device as claimed in claim 1, wherein the pressure sensor (105) is attached to the conductive groove (110) and the electromagnet (103) is arranged directly behind the conductive groove (110); the power panel (108) rests in the ground and is covered by a safety cover (201), a right end of the safety cover (201) is connected with the ground via an axle (204) and the other end can move freely; the spring (202) connects the safety cover (201) with the ground; when the power panel (108) lies flat, its upper left corner is connected with the ground via the motor (102).

3. The automatic charging device as claimed in claim 1, wherein the three-phase voltage source (301), the rectifier (302), the DC/DC device (303) and the charging controller (304) are arranged in the ground.

4. The automatic charging device as claimed in claim 2, wherein the three-phase voltage source (301), the rectifier (302), the DC/DC device (303) and the charging controller (304) are arranged in the ground.

5. The automatic charging device as claimed in claim 1, wherein the hook shaped charging connector (104) is in folded state when not operating, the motor on the movable module (203) drives the first rectangular module (402) to a position at which the first rectangular module (402) is parallel with the movable module (203), and meanwhile the motor at the other end of the second rectangular module (401) drives the second rectangular module (401) to a position at which the second rectangular module (401) is parallel with the first rectangular module (402); when the hook shaped charging connector (104) is operating, the motor on the movable module (203) drives the first rectangular module (402) to a position at which the first rectangular module (402) is at an angle of 30 degree to the movable module (203), and meanwhile the motor at the other end of the second rectangular module (401) drives the second rectangular module (402) to a position at which the second rectangular module (401) is at an angle of 30 degree to the first rectangular module (402), and the hook shaped charging connector (104) stretches out to become hook-shaped for connection with the ground power source.

6. The automatic charging device as claimed in claim 2, wherein the hook shaped charging connector (104) is in folded state when not operating, the motor on the movable module (203) drives the first rectangular module (402) to a position at which the first rectangular module (402) is parallel with the movable module (203), and meanwhile the motor at the other end of the second rectangular module (401) drives the second rectangular module (401) to a position at which the second rectangular module (401) is parallel with the first rectangular module (402); when the hook shaped charging connector (104) is operating, the motor on the movable module (203) drives the first rectangular module (402) to a position at which the first rectangular module (402) is at an angle of 30 degree to the movable module (203), and meanwhile the motor at the other end of the second rectangular module (401) drives the second rectangular module (402) to a position at which the second rectangular module (401) is at an angle of 30 degree to the first rectangular module (402), and the hook shaped charging connector (104) stretches out to become hook-shaped for connection with the ground power source.

7. A charging method for the automatic charging device as claimed in claim 1, comprising the following steps:
   Step 1: the AGV, after an operational cycle from a quay crane to a container yard of the container terminal, whose vehicle charging controller processing positional information read from the RFID label array embedded in the container yard, entering the charging buffer region for charging, or lining up in the charging waiting region in case of another AGV under charging process in the charging region;
   Step 2: the AGV entering the charging region, and transmitting the positional information of a first RFID label (101) at a left side of the charging region read by the RFID read-write coil (109) at the front end of the AGV to the vehicle charging controller (306) via a wireless signal; the vehicle charging controller (306) transmitting the wireless signal to the ground wireless module (502) of the ground device via the wireless module (501), and causing the ground charging controller (304) to operate the motor (102) arranged in the power panel (108) in the ground to erect the power panel (108) and to push up the safety cover (201); the vehicle charging controller (306) enabling the motor (102) on the movable module (203) to drive the first rectangular module (402) to a position at which the first rectangular (402) module is at an angle of 30 degree to the movable module (203), and meanwhile enabling the motor at the other end of the second rectangular module (401) to drive the second rectangular module (401) to a position at which the second rectangular module (401) is at an angle of 30 degree to the first rectangular module (402); the hook shaped charging connector (104) then stretching out to become hook-shaped and ready for connection with the ground power source for powering on the electromagnet (103) at the upper side of the power panel (108);
   Step 3: the AGV arriving and stopping at the charging region, the AGV determining a parking position via the positional information of the RFID label on the ground read by the RFID read-write coils on the front and rear of the AGV, with the hook shaped charging connector (104) at the parking position of the AGV facing the power panel (108) in the charging region; the electromagnet attracting the hook shaped charging connector (104), causing the charging plug to be inserted stably into the power panel (108) and the charging plug (111) to be connected with the conductive groove (110);
   Step 4: the pressure sensor (105) on the power panel sending out a signal to the ground charging controller (304), the ground charging controller (304) connecting the conductive groove (110) to a shore power an external power source by means of processing the signal, and the AGV starting a charging process;
   Step 5: the power measuring module (107), at detecting that the AGV is fully charged, as is indicated by a specific threshold of a measured current thereof, transmitting a signal to the ground wireless module (502) of the ground device via the vehicle-mounted wireless module (501); the ground charging controller (304) processing the signal and powering off the electromagnet (103) and the conductive groove (110), causing the power panel (108) to fold down and the safety cover (201) to cover up under stress of the spring (202); meanwhile, the vehicle charging controller (306) controlling the motor on the movable module (203) to cause the first rectangular module (402) to become parallel with the movable module (203) and the motor at the other end of the second rectangular module (401) to cause the second rectangular module (401) to become parallel with the first rectangular module (402); the hook-type charging connector contracting and detaching from the ground power source; and the AGV leaving the charging region.

* * * * *